United States Patent
Kao et al.

(10) Patent No.: US 10,163,878 B2
(45) Date of Patent: Dec. 25, 2018

(54) SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Min-Feng Kao, Chiayi (TW); Dun-Nian Yaung, Taipei (TW); Jen-Cheng Liu, Hsin-Chu (TW); Hsing-Chih Lin, Tainan (TW); Ching-Chun Wang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/468,852

(22) Filed: Mar. 24, 2017

(65) Prior Publication Data
US 2018/0277526 A1 Sep. 27, 2018

(51) Int. Cl.
*H01L 25/16* (2006.01)
*H01L 25/065* (2006.01)
(Continued)

(52) U.S. Cl.
CPC ........ *H01L 25/16* (2013.01); *H01L 21/76898* (2013.01); *H01L 23/481* (2013.01); *H01L 23/485* (2013.01); *H01L 23/528* (2013.01); *H01L 23/5226* (2013.01); *H01L 23/5227* (2013.01); *H01L 23/535* (2013.01); *H01L 24/08* (2013.01); *H01L 25/0657* (2013.01); *H01L 28/10* (2013.01); *H01L 2224/08146* (2013.01);
(Continued)

(58) Field of Classification Search
CPC . H01L 23/481; H01L 23/485; H01L 23/5226; H01L 23/5227; H01L 23/528; H01L 23/535; H01L 21/76898; H01L 25/16; H01L 25/0657
See application file for complete search history.

(56) References Cited

U.S. PATENT DOCUMENTS 5,930,637 A * 7/1999 Chuang ................. H01L 28/10
257/531
2009/0057824 A1 * 3/2009 Kwak ................ H01L 21/7682
257/531

(Continued)

*Primary Examiner* — Mark Tornow
(74) *Attorney, Agent, or Firm* — WPAT, P.C., Intellectual Property Attorneys; Anthony King

(57) ABSTRACT

A semiconductor structure is disclosed. The semiconductor structure includes: a semiconductor substrate including a front surface and a back surface; a backside metallization layer formed over the semiconductor substrate, the backside metallization layer being closer to the back surface than to the front surface of the semiconductor substrate, at least a portion of the backside metallization layer forming an inductor structure; and an electrically non-conductive material formed in the semiconductor substrate, the electrically non-conductive material at least partially overlapping the inductor structure from a top view, and the electrically non-conductive material including a top surface, a bottom surface, and sidewalls, the top surface being adjacent to the back surface of the semiconductor substrate. A method for manufacturing a semiconductor structure is also disclosed.

20 Claims, 16 Drawing Sheets

(51) Int. Cl.
*H01L 23/48* (2006.01)
*H01L 23/535* (2006.01)
*H01L 23/522* (2006.01)
*H01L 23/528* (2006.01)
*H01L 23/00* (2006.01)
*H01L 21/768* (2006.01)
*H01L 23/485* (2006.01)
*H01L 49/02* (2006.01)

(52) U.S. Cl.
CPC ............... *H01L 2225/06524* (2013.01); *H01L 2225/06527* (2013.01); *H01L 2225/06544* (2013.01); *H01L 2225/06565* (2013.01)

(56) References Cited

U.S. PATENT DOCUMENTS

2014/0029222 A1* 1/2014 Saito ...................... H05K 1/186
    361/762
2015/0255528 A1* 9/2015 Dunn .................. H01L 23/3171
    257/531
2016/0343809 A1* 11/2016 Green ................. H01L 29/2003

* cited by examiner

SEMICONDUCTOR STRUCTURE AND METHOD FOR MANUFACTURING THE SAME

BACKGROUND

Advances in semiconductor IC (integrated circuit) chip fabrication and packaging technologies have enabled development of highly integrated semiconductor IC chips and compact chip package structures as well as electronic modules. Passive components such as capacitors, resistors and inductors are fundamental circuit components that are commonly used in chip fabrication and packaging designs. In particular, inductors are typically used in analog and mixed signal chip designs for constructing various circuits such as voltage controlled oscillators (VCOs), low-noise amplifiers (LNAs), mixers, filters and other integrated circuits. Passive components such as inductors can be fabricated as off-chip or on-chip components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, dimensions of the various features may be arbitrarily increased or reduced for clarity of discussion.

DETAILED DESCRIPTION

Figure 1:
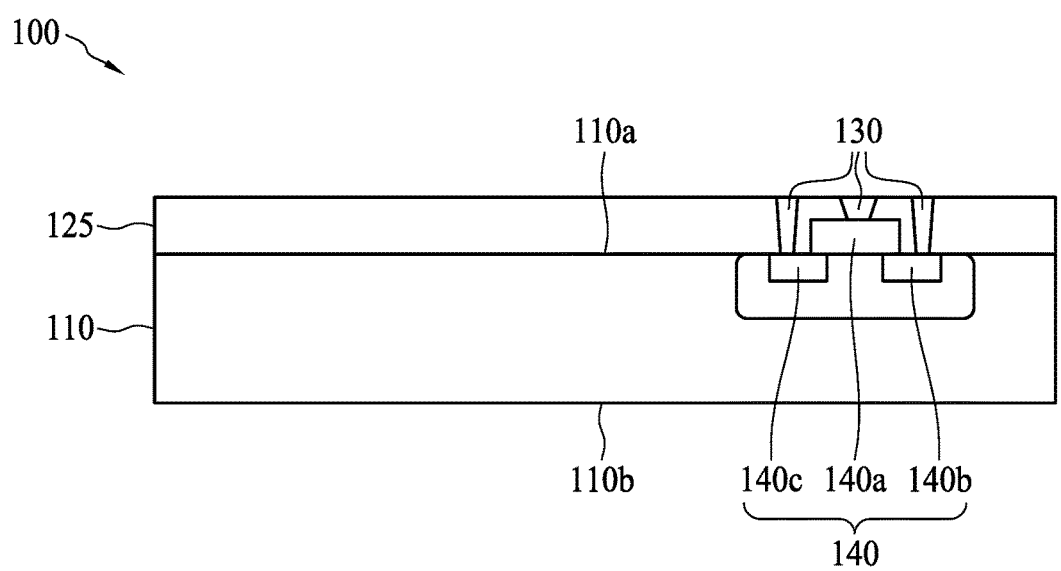
FIGS. 1 to 7 are diagrammatic fragmentary cross-sectional side views of a semiconductor device at various stages of its fabrication according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments and configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating or working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIGS. 1 to 7 are diagrammatic fragmentary cross-sectional side views of a semiconductor device 100 at various stages of its fabrication according to a first embodiment of the present disclosure. It is understood that FIGS. 1 to 7 have been simplified for a better understanding of the inventive concepts of the present disclosure.

Referring to FIG. 1, a semiconductor substrate 110 (or a wafer) has a front (active) side 110a and a back (non-active) side 110b. The substrate 110 may be a bulk silicon substrate. Alternatively, the substrate 110 may be comprised of an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. The substrate 110 may also include a silicon-on-insulator (SOI) substrate. SOI substrates are fabricated using separation by implantation of oxygen (SIMOX), wafer bonding, and/or other suitable methods. Some exemplary substrates 110 include an insulator layer. The insulator layer may be comprised of any suitable material, including silicon oxide, sapphire, other suitable insulating materials, and/or combinations thereof. An exemplary insulator layer may be a buried oxide layer (BOX). The insulator may be formed by any suitable process, such as implantation (e.g., SIMOX), oxidation, deposition, and/or other suitable process.

The substrate 110 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 110, in a P-well structure, in an N-well structure, in a dual-well structure, or using a raised structure. The semiconductor substrate 110 may further include various active regions, such as regions configured for an N-type metal-oxidesemiconductor transistor device and regions configured for a P-type metal-oxide-semiconductor transistor device.

More specifically, on the front side 110a of the substrate 110, a plurality of STI (shallow trench isolation) regions (not shown) may be formed to define active regions for a circuit component 140. In the exemplary embodiment, the circuit component 140 is depicted as a transistor having a gate element 140a and diffusion regions 140b and 140c formed in the substrate 110 providing drain/source elements for the transistor. The circuit component 140 can be formed using standard FEOL fabrication techniques known to those of ordinary skill in the art.

As depicted in FIG. 1, after the circuit component 140 is formed, a dielectric or insulation layer 125 is formed to cover the circuit component 140 using standard BEOL (back-end of line) fabrication techniques. Contact plugs 130 are formed in the dielectric or insulation layer 125 to provide contacts between gate/drain/source terminals of the circuit component 140 and a metallization level formed over the dielectric or insulation layer 125 during subsequent steps of the embodiment as described below. The contact plugs 130 may be formed of standard materials such as copper or tungsten.

After formation of the contact plugs 130, processing continues to complete the front side metallization. For instance, referring to FIG. 2, a plurality of metallization layers 170 and a plurality of inter-level contact plugs 165 are formed of metallic material such as copper, aluminum, or alloys thereof, using known techniques such as damascene, dual damascene, or subtractive metal etching. Although the exemplary embodiments described herein depict five metal layers, this is merely illustrative and it should be understood that the semiconductor device 100 may alternatively be formed with more or fewer metal layers, depending on the application.

A plurality of inter-level contacts plugs 165 are formed to provide interconnections between the plurality of metallization layers 170. The inter-level contacts plugs 165 and metallization layers 170 are embedded in a plurality of layers of ILD (inter level dielectric) material 175.

Figure 3:
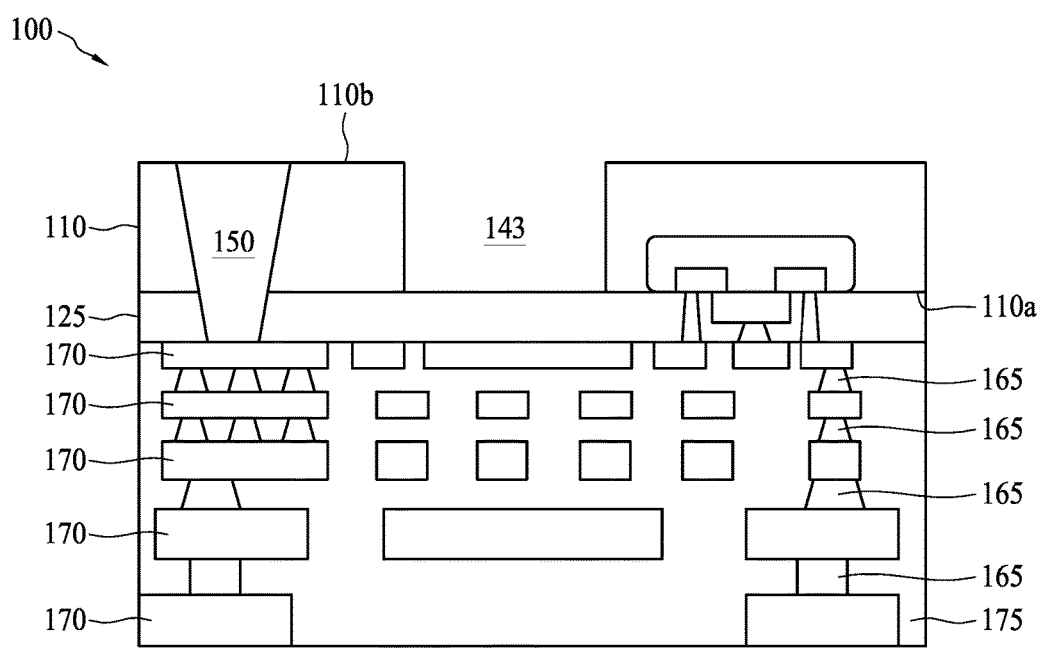

Referring to FIG. 3, the substrate 110 is flipped over and a wafer carrier (not shown) may be temporarily bonded to the substrate 110 over the front side surface 110a during backside processing. In some embodiments, the substrate 110 may be subjected to a polishing/grinding process to thin the wafer. The thinning of the substrate 110 serves to reduce the length of the through-wafer interconnects that electrically connect the backside components, thereby reducing the series resistance and thus enhancing performance.

An etching process is performed upon the backside surface 110b of the substrate 110 to remove at least a portion of the silicon material of the substrate 110 to form a cavity 143. The etching process may include a dry etch, a wet etch, or a combination thereof. A bottom surface of the cavity 143 is recessed into the backside surface 110b of the substrate 110. A profile of the cavity 143 may be different from FIG. 3. For example, in some embodiments, the silicon material of the substrate 110 is selectively etched away and the cavity 143 extends downwardly until the dielectric or insulation layer 125 is exposed. In this case a depth of the cavity is not less than a thickness of the substrate 110. In some embodiments, the cavity 143 does not pass through the substrate 110, and the dielectric or insulation layer 125 is not exposed at the time when the etching process is performed. In this case the depth of the cavity is less than the thickness of the substrate 110. In some embodiments, when a wet etching process is employed, the profile of the cavity 143 may be formed according to a crystal orientation of the substrate 110. For example, the sidewalls of the cavity 143 may be tapered from the backside surface 110b of the substrate 110 toward the front side surface 110a of the substrate 110. In some embodiments, the sidewalls of the cavity 143 may be perpendicular to the backside surface 110b of the substrate 110.

Contact vias 150 may be formed through the substrate 110 to the front side contacts in the metallization layers 170. The contact vias 150 may be formed using known photolithographic methods, where a photoresist mask pattern is formed having openings that define contact via holes. In one exemplary embodiment of the disclosure, the contact vias 150 are formed to electrically connect a backside inductor coil formed in subsequent steps of the embodiment to the front side contacts in the metallization layer 170.

Figure 4:
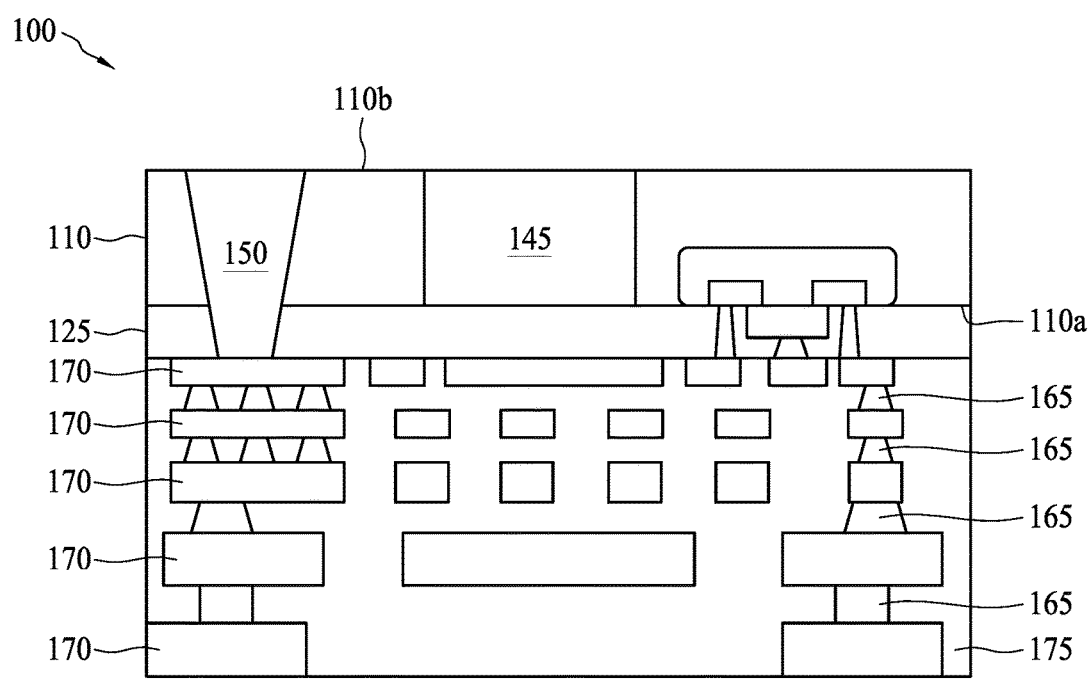

Referring to FIG. 4, the cavity 143 in the substrate 110 is filled with an electrically non-conductive material 145, including dielectric material such as silicon oxide, silicon nitride, or other suitable material. The position of the electrically non-conductive material 145 is configured to allow an inductor coil to be located directly over the electrically non-conductive material 145 during subsequent steps of the embodiment to form a backside inductor. A purpose of the electrically non-conductive material 145 is to reduce the induction of eddy currents in the substrate 110. Eddy currents (also called Foucault currents) are loops of electrical current induced within conductors by a changing magnetic field in the conductor, due to Faraday's law of induction. Eddy currents flow in closed loops within conductors, in planes perpendicular to the magnetic field. They can be induced within nearby stationary conductors by a time-varying magnetic field created by an AC electromagnet or transformer, for example. According to Lenz's law, an eddy current creates a magnetic field that opposes the magnetic field that created it, and thus the eddy current reacts back on the source of the magnetic field. Such back reaction can cause power loss on the source of the magnetic field. The current flowing through the resistance of the conductor also dissipates energy as heat in the material.

Figure 5:
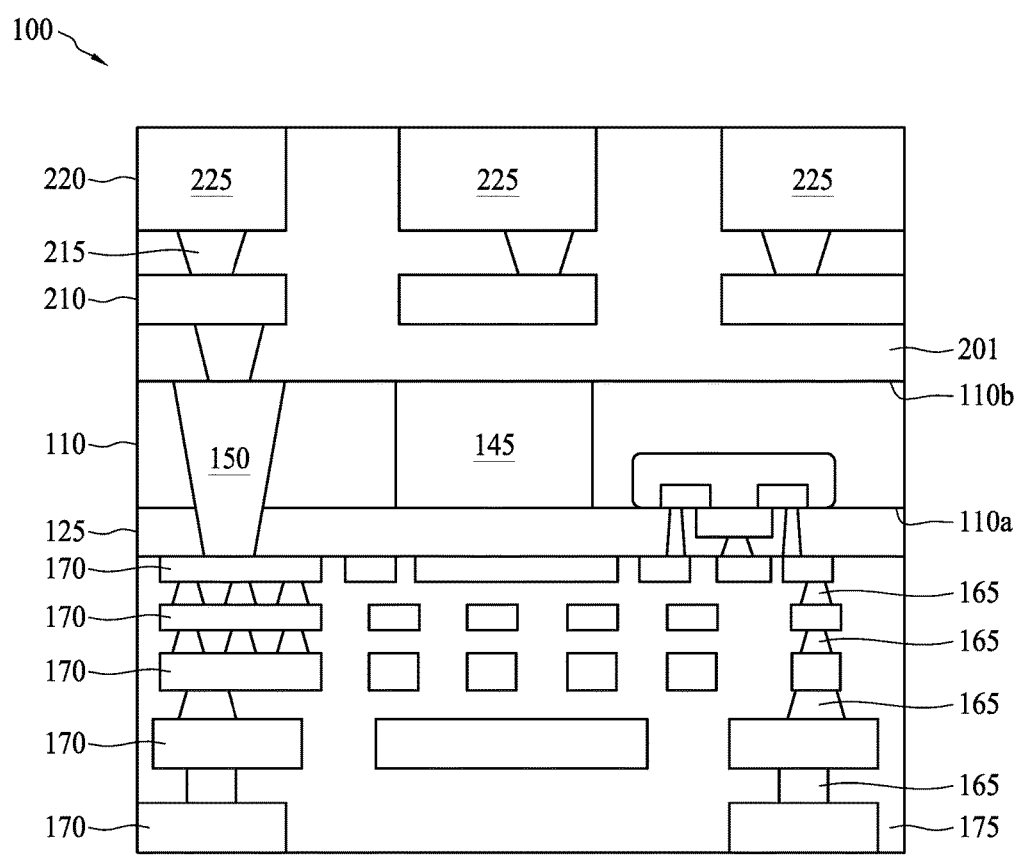

Referring to FIG. 5, a backside dielectric or insulation layer 201 is formed over the backside surface 110b of the substrate 110. The dielectric or insulation layer 201 may be formed of an insulation/dielectric material such as silicon oxide, polyimide, and other suitable materials. The dielectric or insulation layer 201 can be formed by blanket depositing an insulating or dielectric material using spin-on, CVD or other known technique. Preferably, the insulating layer 201 is formed with a material having a dielectric constant that is as low as possible, in order to optimize the inductor performance.

A first metallization layer 210, a second metallization layer 220, and inter-level contact plugs 215 are formed using known techniques with conductive materials. The first metallization layer 210 may have a thickness of about 8500 angstroms. The second metallization layer 220 may have a thickness of about 35000 angstroms and is configured to accommodate an inductor structure 225. The inductor structure 225 may be a series of spirally patterned conductor layers formed from any of several conductive materials known in the art of microelectronic fabrication for forming inductor structures within microelectronic fabrications, such conductive materials being selected from the group including but not limited to: (1) nonmagnetic metal and non-magnetic metal alloy (such as but not limited to aluminum, aluminum alloy, copper or copper alloy) conductive materials; (2) magnetic metal and magnetic metal alloy (such as permalloy and higher order alloys incorporating permalloy alloy) conductive materials; (3) doped polysilicon (having a dopant concentration greater than about 1E15 dopant atoms per cubic centimeter) and polycide (doped polysilicon/metal silicide stack) conductive materials; and (3) laminates thereof. Although the exemplary embodiments described herein depict two metal layers in the backside metallization layers, this is merely illustrative and it should be understood that the semiconductor device 100 may be formed with more or fewer metal layers, depending on the application.

Please note that the electrically non-conductive material 145 may not fully cover the inductor structure 225 from a top view, although a larger coverage is advantageous to the performance of the inductor structure 225. In some embodiments, the electrically non-conductive material 145 at least partially overlaps the inductor structure 225 from a top view. In some embodiments, the electrically non-conductive material 145 fully covers the inductor structure 225 from a top view. In the exemplary embodiment, a center of the inductor structure 225 is aligned with a center of the electrically non-conductive material 145 from a top view to effectively reduce the induction of eddy currents in the substrate 110. However, this is not a limitation of the present disclosure.

Figure 6:
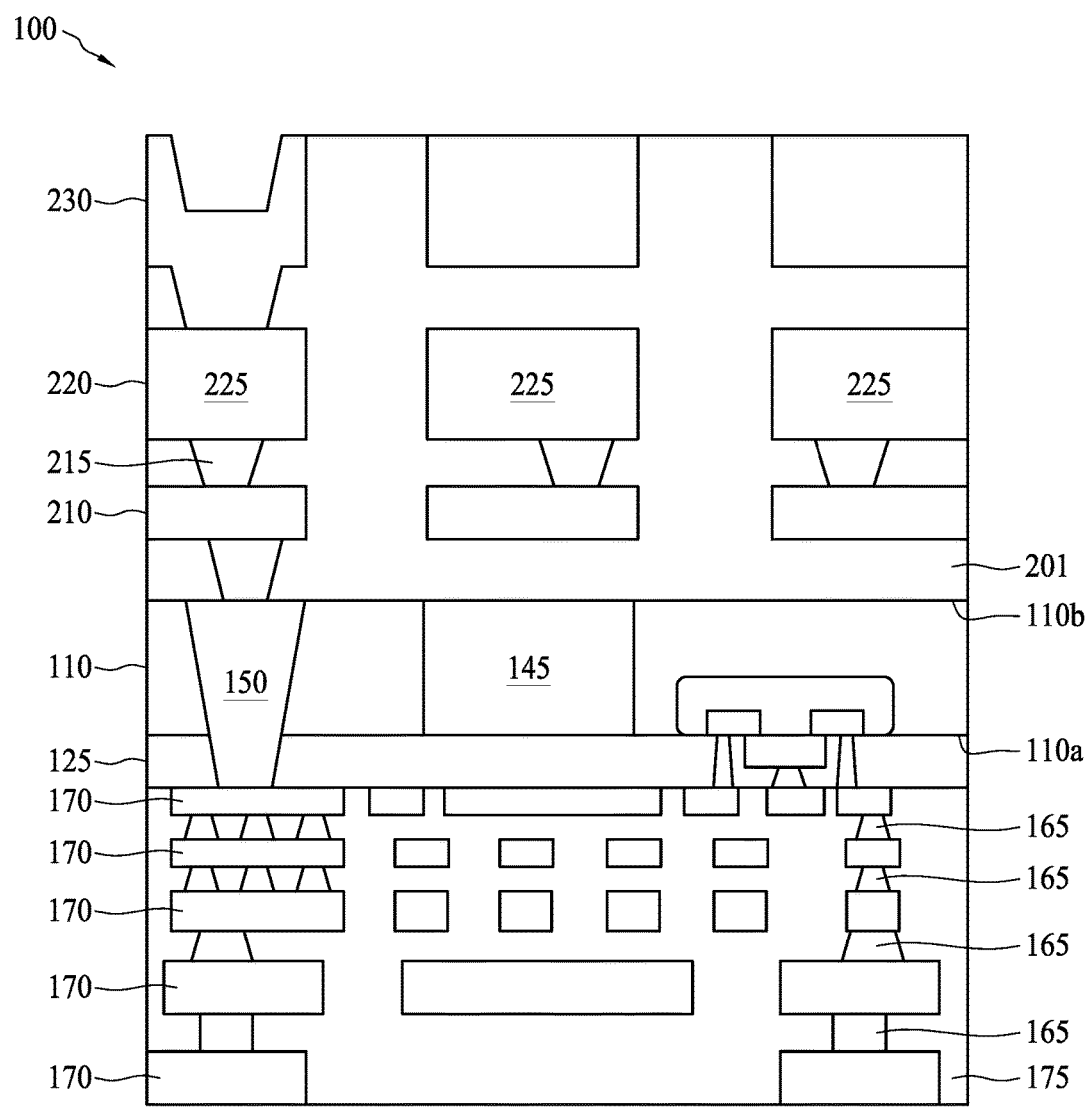
Figure 7:
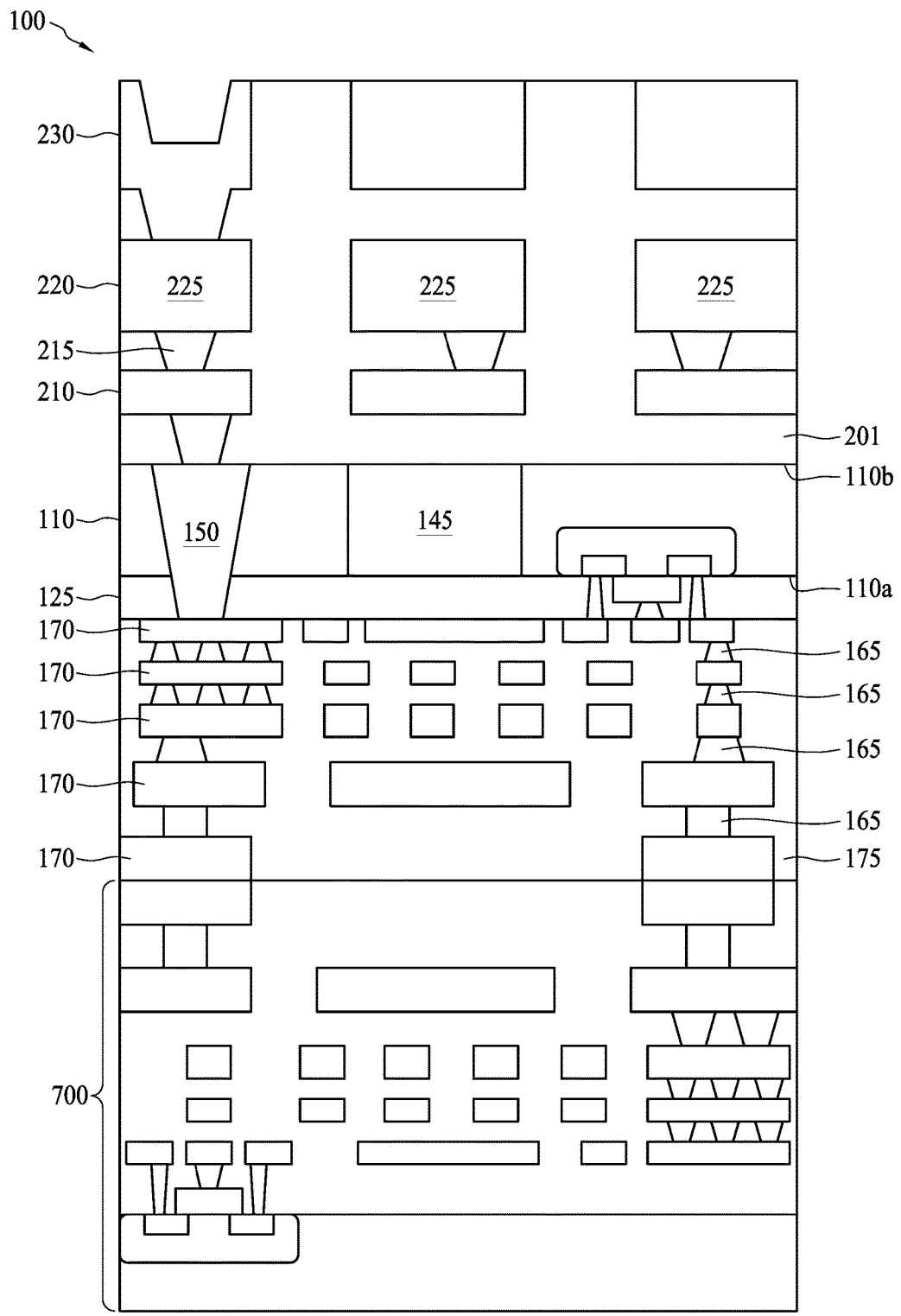

Referring to FIG. 6, a third metallization layer 230 is formed over the second metallization layer 220. The third metallization layer 230 may include, for example, a metal pad, which may be an aluminum pad or an aluminum copper pad. In some embodiments, a portion of the first metallization layer 210 and/or a portion of the third metallization layer 230 may be configured to form the inductor together with the second metallization layer 220. Referring to FIG. 7, another integrated chip 700 is bonded to the semiconductor device 100 of FIG. 6 in a face-to-face (F2F) configuration. In some embodiments, the bonding may include bump-less copper to copper bonding. In other embodiments, the bonding may include fusion or hybrid bonding.

FIGS. 8 to 13 are diagrammatic fragmentary cross-sectional side views of a semiconductor IC device 200 at various stages of its fabrication according to a second embodiment of the present disclosure. It is understood that FIGS. 8 to 13 have been simplified for a better understanding of the inventive concepts of the present disclosure. In addition, features in FIGS. 8 to 13 that are similar to analogous features in FIGS. 1 to 7 are similarly numbered for the sake of simplicity and clarity.

Figure 2:
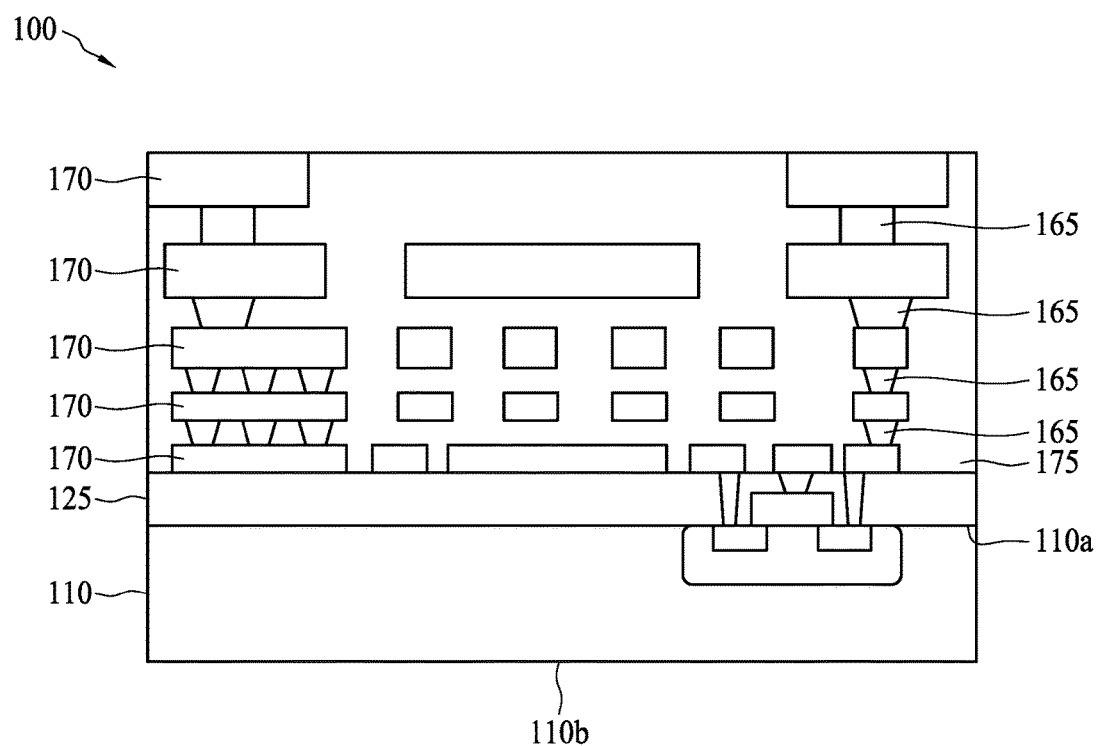
Figure 8:
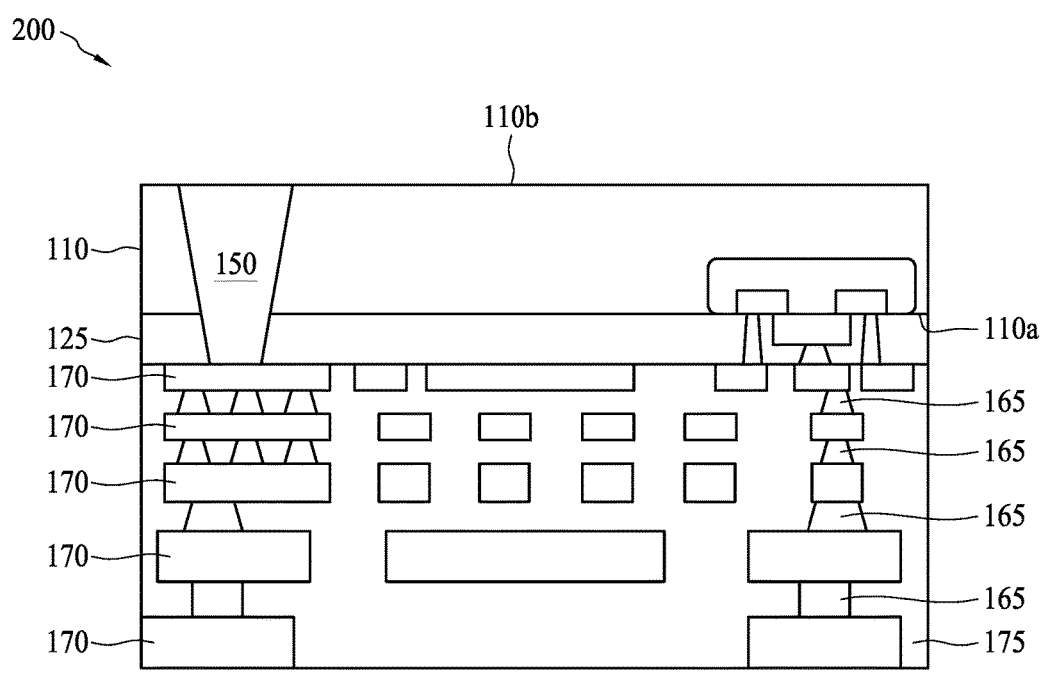
FIGS. 8 to 13 are diagrammatic fragmentary cross-sectional side views of a semiconductor IC device at various stages of its fabrication according to a second embodiment of the present disclosure.
Figure 9:
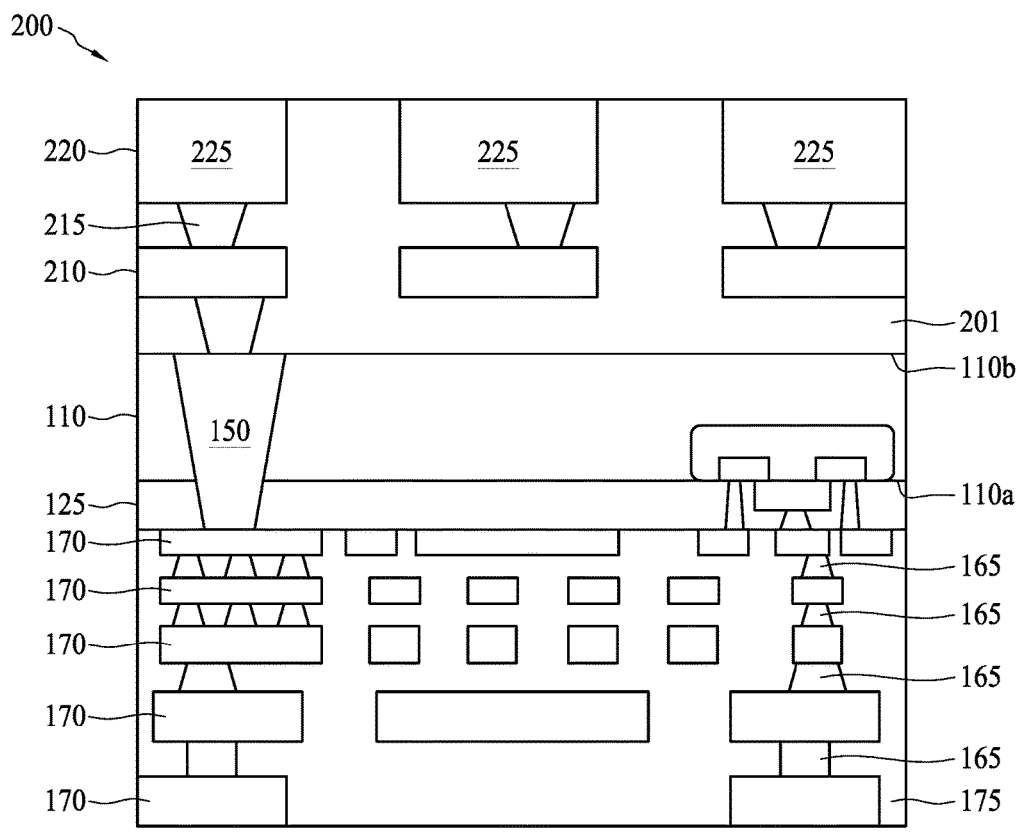

Referring to FIG. 8, the fabrication process continues with the semiconductor device 100 of FIG. 2 flipped over for backside processing. However, unlike the semiconductor device 100, the semiconductor device 200 is not etched before the formation of the backside dielectric or insulation layer 201. Referring to FIG. 9, the backside dielectric or insulation layer 201 is formed over the backside surface 110b of the substrate 110. The dielectric or insulation layer 201 may be formed of an insulation/dielectric material such as silicon oxide, polyimide, or other suitable material. The dielectric or insulation layer 201 can be formed by blanket depositing an insulating or dielectric material using spin-on, CVD or other known techniques. Preferably, the insulating layer 201 is formed with a material having a dielectric constant that is as low as possible in order to optimize the inductor performance.

The first metallization layer 210, the second metallization layer 220, and the inter-level contact plugs 215 are formed using known techniques with conductive materials. The first metallization layer 210 may have a thickness of about 8500 angstroms. The second metallization layer 220 may have a thickness of about 35000 angstroms and is configured to accommodate an inductor structure 225. The inductor structure 225 may be a series of spirally patterned conductive layers formed from any of several conductive materials known in the art of microelectronic fabrication for forming inductor structures within microelectronic fabrications, such conductive materials being selected from the group including but not limited to: (1) nonmagnetic metal and non-magnetic metal alloy conductive materials (such as but not limited to aluminum, aluminum alloy, copper and copper alloy); (2) magnetic metal and magnetic metal alloy conductive materials (such as permalloy and higher order alloys incorporating permalloy alloy); (3) doped polysilicon (having a dopant concentration greater than about 1E15 dopant atoms per cubic centimeter) and polycide (doped polysilicon/metal silicide stack) conductive materials; and (3) laminates thereof. Although the exemplary embodiments described herein depict two metal layers in the backside metallization layers, this is merely illustrative and it should be understood that the semiconductor device 200 may be formed with more or fewer metal layers, depending on the application.

Figure 10:
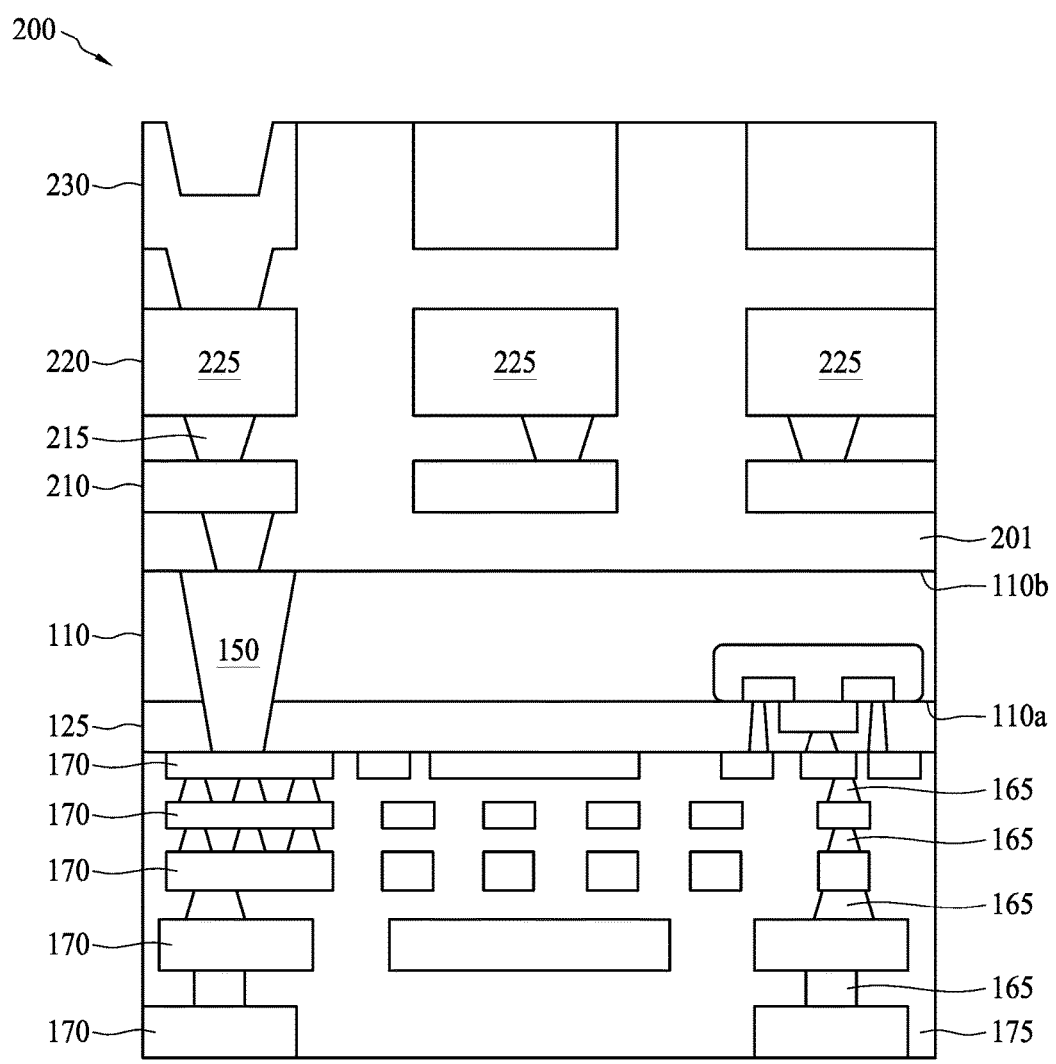
Figure 11:
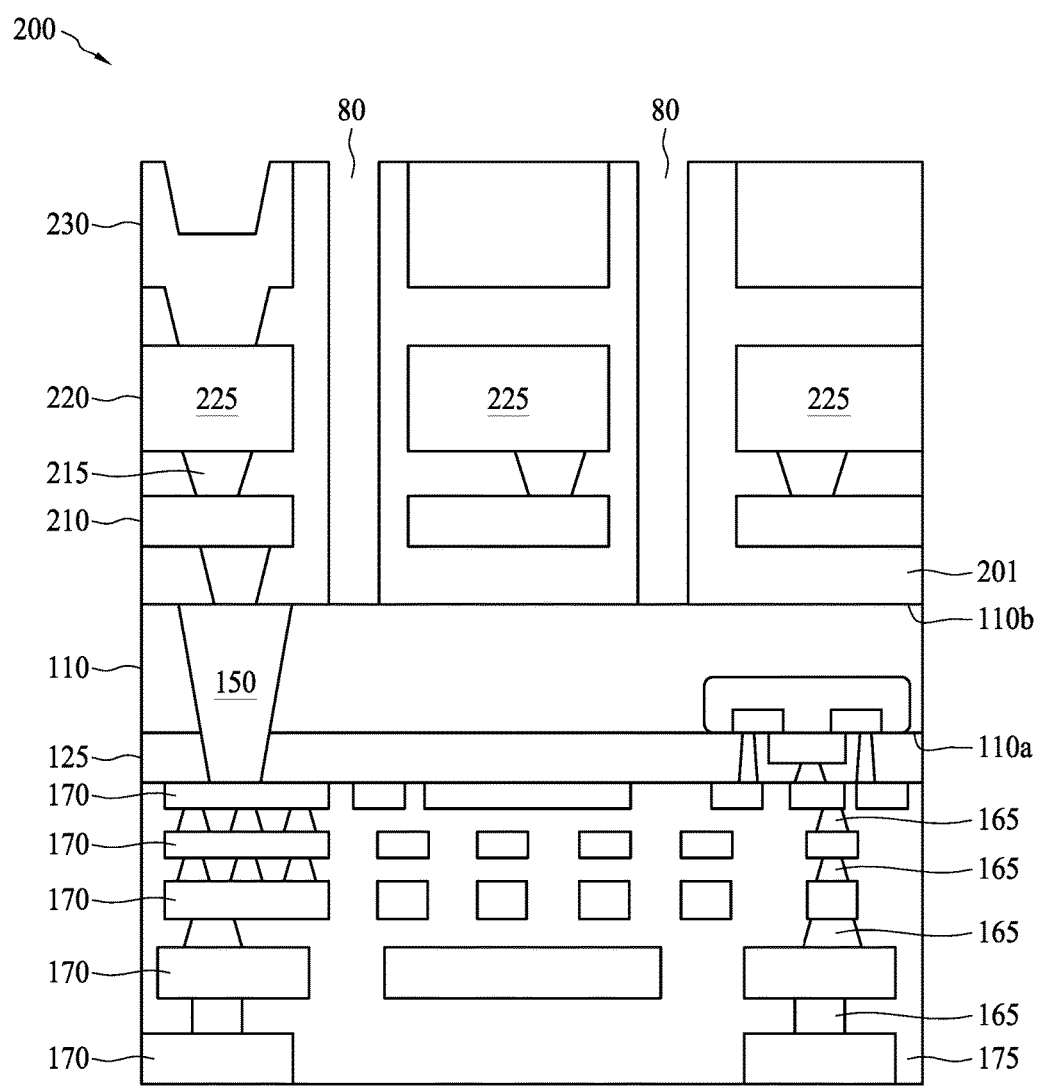

Referring to FIG. 10, the third metallization layer 230 is formed over the second metallization layer 220. The third metallization layer 230 may include, for example, a metal pad, which may be an aluminum pad or an aluminum copper pad. Referring to FIG. 11, a portion of the backside dielectric or insulation layer 201 is removed to form one or more recesses 80 in the backside dielectric or insulation layer 201. At least a portion of the substrate 110 is then exposed. At least one of the recesses 80 may pass through a gap of the spirally patterned inductor structure 225. Please note that the recesses 80 may not necessarily be straight from one end of the backside dielectric layer 201 to the substrate 110 as shown in FIG. 11. The backside dielectric or insulation layer 201 may be removed by an etching process. For example, the etching process may be a dry etching process. An anisotropic RIE (reactive ion etching) $CHF_3/O_2$ dry etchant may be employed to etch the backside dielectric or insulation layer 201, and to expose the substrate 110. In the embodiment, the inductor structure 225 and the conductive materials in the first metallization layer 210, the inter-level contact plugs 215, and the second metallization layer 220 are not exposed during the etching process. As can be seen in FIG. 11, the inductor structure 225 and the conductive materials are fully encompassed by the remaining portion of the backside dielectric or insulation layer 201 to prevent damage from oxidation.

Figure 12A:
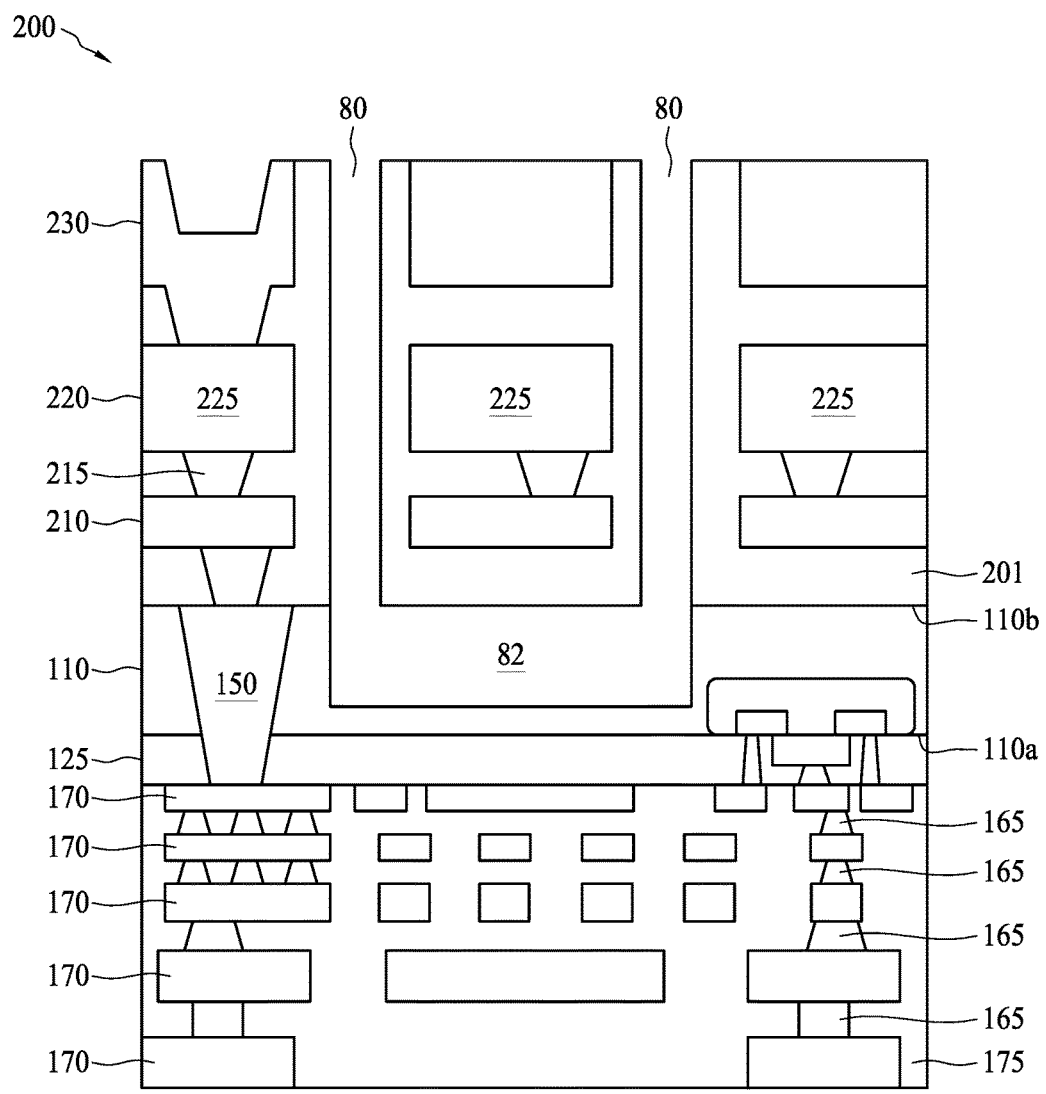

Referring to FIG. 12a, at least a portion of the substrate 110 is removed to form a cavity 82. In the exemplary embodiment, a wet etching process is performed to remove the silicon underlying the inductor structure 225, and to obtain the suspended spiral inductor structure 225. In some embodiments, the etchant may be Tetramethyl ammonium hydroxide (TMAH), tetraethyl ammonium hydroxide (TEAH), ethylenediamene pyrocatecol (EDP), an alkaline hydroxide such as, for example, KOH, NaOH, CeOH, RbOH, and/or a variety of other etchants known in the art. The etchant is applied to the surface of the backside dielectric or insulation layer 201. The etchant then flows into the recesses 80 and finally reaches the substrate 110.

Figure 12B:
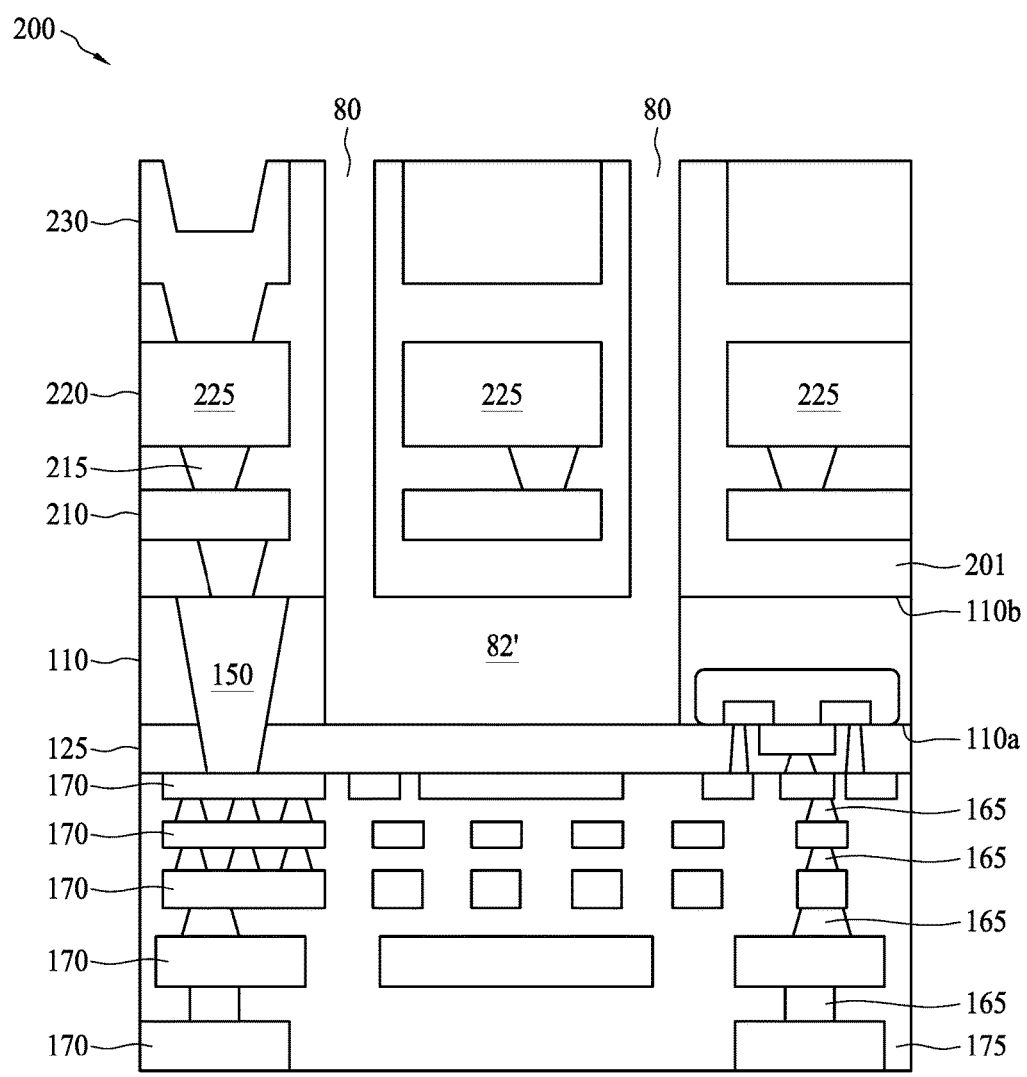

As shown in FIG. 12a, the cavity 82 does not pass through the substrate 110, and the dielectric or insulation layer 125 is not exposed at the time when the etching process is completed. In this case the depth of the cavity is less than the thickness of the substrate 110. However, a profile of the cavity 82 may be different from that shown in FIG. 12a. For example, in some embodiments, the silicon material of the substrate 110 is selectively removed and a cavity 82' extends downwardly until the dielectric or insulation layer 125 is exposed as shown in FIG. 12b. In this case, a depth of the cavity is not less than a thickness of the substrate 110. In some embodiments, the profile of the cavity 82 or 82' may be formed according to a crystal orientation of the substrate 110. For example, the sidewalls of the cavity 82 or 82' may be tapered from the backside surface 110b of the substrate 110 toward the front side surface 110a of the substrate 110. In some embodiments, the sidewalls of the cavity 82 or 82' may be perpendicular to the backside surface 110b of the substrate 110.

Please note that the cavity 82 or 82' may not fully cover the inductor structure 225 from a top view, although a larger coverage is advantageous to the performance of the inductor structure 225. In some embodiments, the cavity 82 or 82' at least partially overlaps the inductor structure 225 from a top view. In some embodiments, the cavity 82 or 82' fully covers the inductor structure 225 from a top view. In the exemplary embodiment, a center of the inductor structure 225 is aligned with a center of the cavity 82 or 82' from a top view to effectively mitigate the induction of eddy currents. However, this is not a limitation of the present disclosure.

Figure 12C:
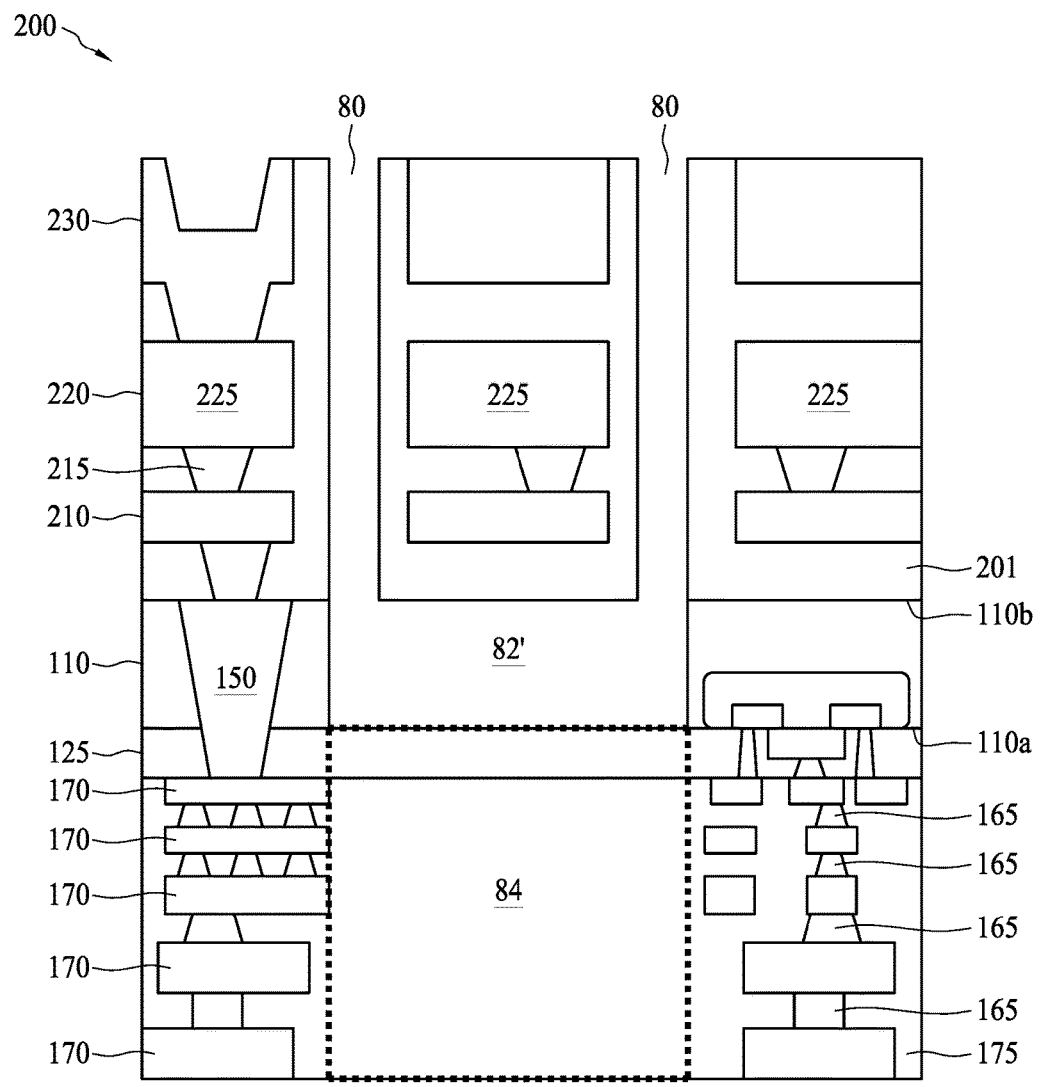

The cavity 82 or 82' therefore functions as an air gap to improve performance of the inductor structure 225 and achieve a high Q-factor. As shown in FIG. 12c, in some embodiments, in order to further reduce the induction of eddy currents, the dielectric or insulation layer 125 and the metallization layers 170 may be configured to include an area 84 free from conductive or metallic material. The area 84 may extend from a bottom surface of the cavity 82' toward the ILD material 175 until the end of the ILD material 175. However, this is not a limitation of the present disclosure. In some embodiments, the area 84 may extend from a bottom surface of the cavity 82' toward the ILD material 175 and stop before the end of the ILD material 175. The area 84 may not fully cover the inductor structure 225 from a top view, although a larger coverage is advantageous to the performance of the inductor structure 225. In some embodiments, the area 84 at least partially overlaps the inductor structure 225 from a top view. In some embodiments, the area 84 fully covers the inductor structure 225 from a top view. In the exemplary embodiment, a center of the inductor structure 225 is aligned with a center of the area 84 from a top view to effectively reduce the induction of eddy currents. However, this is not a limitation of the present disclosure.

Figure 13:
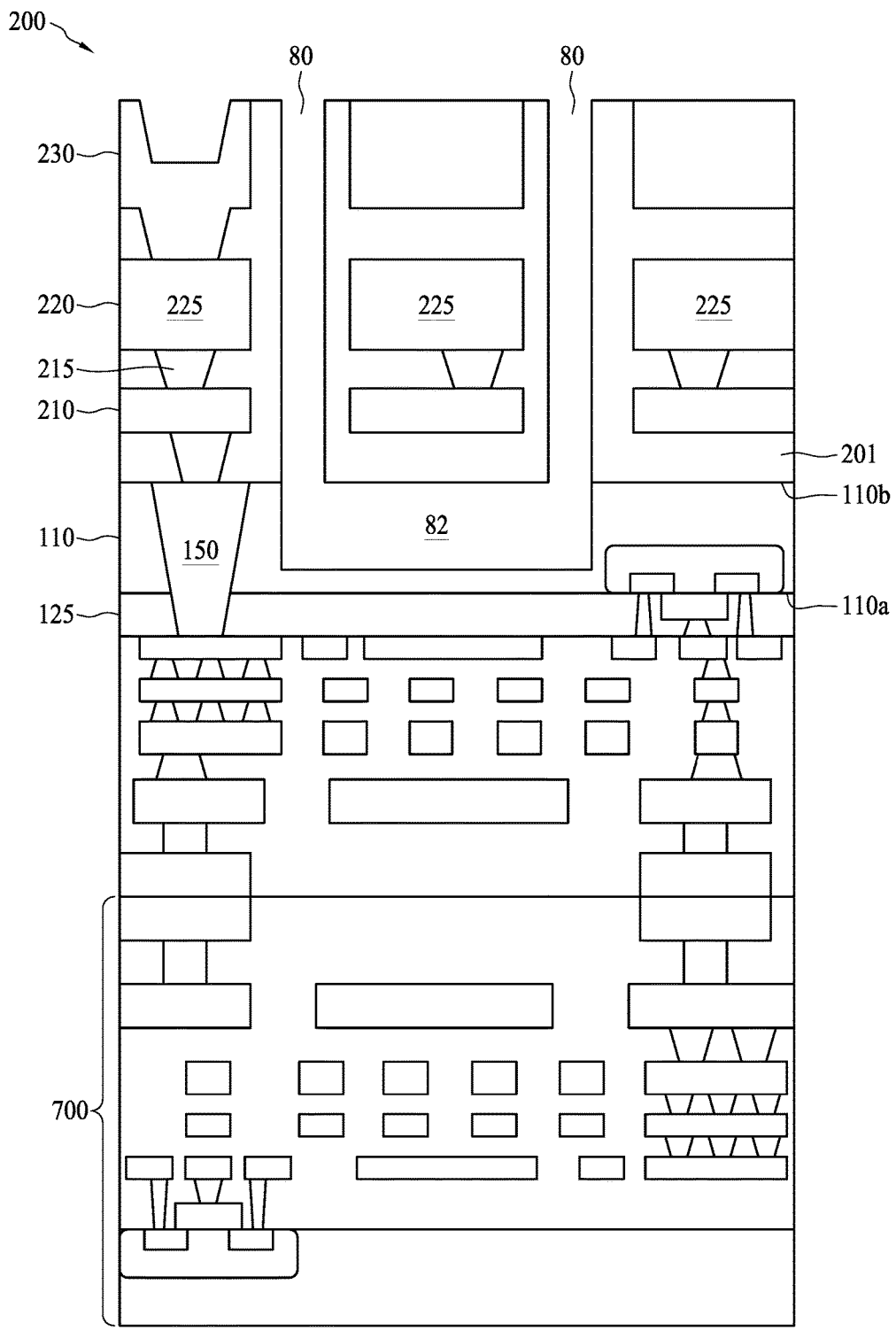

Referring to FIG. 13, the integrated chip 700 is bonded to the semiconductor device 200 of FIG. 12a in a face-to-face (F2F) configuration. Although not shown in the figures, the integrated chip 700 may be bonded to the semiconductor device 200 of FIGS. 12b and 12c in a F2F configuration as well. In some embodiments, the bonding may include bumpless copper to copper bonding. In other embodiments, the bonding may include fusion or hybrid bonding.

Figure 14:
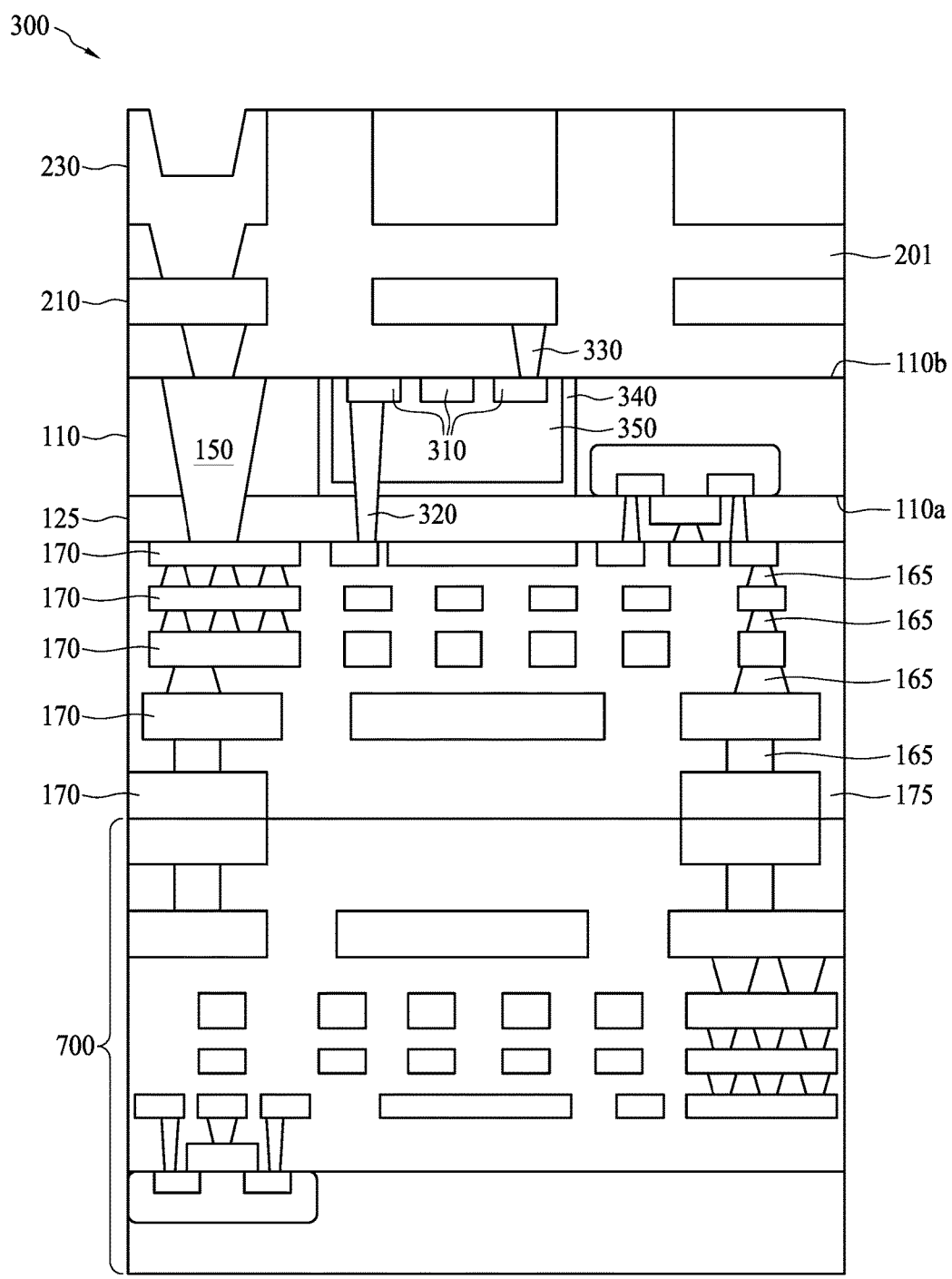
FIG. 14 is a diagrammatic fragmentary cross-sectional side view of a semiconductor IC device according to a third embodiment of the present disclosure.

FIG. 14 is a diagrammatic fragmentary cross-sectional side view of a semiconductor IC device 300 according to a third embodiment of the present disclosure. It is understood that FIG. 14 has been simplified for a better understanding of the inventive concepts of the present disclosure. In addition, similar features in FIG. 7, FIG. 13 and FIG. 14 are numbered the same for the sake of simplicity and clarity.

Referring to FIG. 14, an inductor structure 310 is configured to be disposed in the substrate 110 instead of at the backside metallization layers 210 to 230 as in the previous embodiments. Specifically, the inductor structure 310 is located in a cavity 350 in the substrate 110. Sidewalls and a bottom of the cavity 350 are not in contact with the inductor structure 310. The cavity 350 therefore produces an environment that keeps the inductor structure 310 distanced from the substrate 110. In this way, the induction of eddy currents in the substrate 110 may be reduced. In order to further reduce the induction of eddy currents, the sidewalls of the cavity 350 may be lined with an electrically non-conductive material 340, including dielectric material such as silicon oxide, silicon nitride, or other suitable materials.

The electrically non-conductive material 340 may further extend to the bottom of the cavity 350 in order to further isolate the inductor structure 310 from conductive materials like the metallization layers 170 below the inductor structure 310. However, this is not a limitation of the present disclosure. In some embodiments, the sidewalls and/or the bottom of the cavity 350 may not be lined by the electrically non-conductive material 340. In some embodiments, the electrically non-conductive material 340 may further extend to a top of the cavity 350. In the exemplary embodiment, a center of the inductor structure 310 is aligned with a center of the cavity 350 from a top view. However, this is not a limitation of the present disclosure.

The inductor structure 310 may be coupled to the upper first metallization layer 210 through a contact via 330. The inductor structure 310 may be coupled to the metallization layers 170 below through a contact via 320. The inductor structure 310 may be a series of spirally patterned conductor layers formed from any of several conductive materials known in the art of microelectronic fabrication for forming inductor structures within microelectronic fabrications, such conductive materials being selected from the group including but not limited to: (1) nonmagnetic metal and nonmagnetic metal alloy conductive materials (such as aluminum, aluminum alloy, copper and copper alloy); (2) magnetic metal and magnetic metal alloy conductive materials (such as permalloy and higher order alloys incorporating permalloy alloy); (3) doped polysilicon (having a dopant concentration greater than about 1E15 dopant atoms per cubic centimeter) and polycide (doped polysilicon/metal silicide stack) conductive materials; and (3) laminates thereof.

Some embodiment of the present disclosure provides a semiconductor structure, including: a semiconductor substrate including a front surface and a back surface; a backside metallization layer formed over the semiconductor substrate, the backside metallization layer being closer to the back surface than to the front surface of the semiconductor substrate, and at least a portion of the backside metallization layer forming an inductor structure; and an electrically non-conductive material formed in the semiconductor substrate, the electrically non-conductive material at least partially overlapping the inductor structure from a top view, and the electrically non-conductive material including a top surface, a bottom surface, and sidewalls, the top surface being adjacent to the back surface of the semiconductor substrate.

Some embodiment of the present disclosure provides a semiconductor structure, including: a semiconductor substrate including a front surface and a back surface; an inductor structure disposed over the semiconductor substrate, the inductor structure being closer to the back surface than to the front surface of the semiconductor substrate; and a cavity formed in the semiconductor substrate, the cavity at least partially overlapping the inductor structure from a top view, and the cavity including a top surface, a bottom surface, and sidewalls, the top surface being adjacent to the back surface of the semiconductor substrate.

Some embodiment of the present disclosure provides a method for manufacturing a semiconductor structure, including: providing a semiconductor substrate having a front surface and a back surface; forming a backside metallization layer at the back surface of the semiconductor substrate, at least a portion of the backside metallization layer forming an inductor structure; performing a dry etching process upon the backside metallization layer to expose the back surface of the semiconductor substrate; and performing a wet etching process upon the exposed back surface of the semiconductor substrate to form a cavity in the semiconductor substrate, the cavity including a top surface, a bottom surface, and sidewalls, the top surface being adjacent to the back surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
a semiconductor substrate including a front surface and a back surface;
a backside metallization layer formed over the semiconductor substrate, the backside metallization layer being closer to the back surface than to the front surface of the semiconductor substrate, and at least a portion of the backside metallization layer forming an inductor structure;
an electrically non-conductive material formed in the semiconductor substrate, the electrically non-conductive material at least partially overlapping the inductor structure from a top view, and the electrically non-conductive material including a top surface, a bottom surface, and sidewalls, the top surface being adjacent to the back surface of the semiconductor substrate; and
a front-end-of-line (FEOL) layer formed over the semiconductor substrate, the FEOL layer being closer to the front surface than to the back surface of the semiconductor substrate.

2. The semiconductor structure of claim 1, wherein the bottom surface of the electrically non-conductive material is parallel to the front surface of the semiconductor substrate.

3. The semiconductor structure of claim 2, wherein the bottom surface of the electrically non-conductive material formed is adjacent to the front surface of the semiconductor substrate.

4. The semiconductor structure of claim 1, further comprising a front side metallization layer formed over the semiconductor substrate, the front side metallization layer being closer to the front surface than to the back surface of the semiconductor substrate.

5. The semiconductor structure of claim 4, further comprising a semiconductor integrated chip bonded to the front side metallization layer in a face-to-face configuration.

6. The semiconductor structure of claim 5, wherein a bonding between the semiconductor integrated chip and the front side metallization layer includes hybrid bonding.

7. The semiconductor structure of claim 1, wherein the electrically non-conductive material fully covers the inductor structure from the top view.

8. The semiconductor structure of claim 1, wherein a center of the inductor structure is aligned with a center of the electrically non-conductive material from the top view.

9. A semiconductor structure, comprising:
a semiconductor substrate including a front surface and a back surface;
an inductor structure disposed over the semiconductor substrate, the inductor structure being closer to the back surface than to the front surface of the semiconductor substrate;
a cavity formed in the semiconductor substrate, the cavity at least partially overlapping the inductor structure from a top view, and the cavity including a top surface, a bottom surface, and sidewalls, the top surface being adjacent to the back surface of the semiconductor substrate; and
a front-end-of-line (FEOL) layer formed over the semiconductor substrate, the FEOL layer being closer to the front surface than to the back surface of the semiconductor substrate.

10. The semiconductor structure of claim 9, wherein the bottom surface of the cavity is parallel to the front surface of the semiconductor substrate.

11. The semiconductor structure of claim 9, wherein the cavity does not extend to the front surface of the semiconductor substrate.

12. The semiconductor structure of claim 9, wherein the bottom surface of the cavity is adjacent to the front surface of the semiconductor substrate.

13. The semiconductor structure of claim 9, further comprising a recess leading to the cavity, and the cavity being exposed through the recess.

14. The semiconductor structure of claim 13, wherein the inductor structure is spirally patterned with a gap, and the recess aligns with the gap.

15. The semiconductor structure of claim 13, wherein the inductor structure is not exposed through the recess.

16. The semiconductor structure of claim 9, wherein the cavity fully covers the inductor structure from the top view.

17. The semiconductor structure of claim 9, further comprising a front side metallization layer formed over the semiconductor substrate, the front side metallization layer being closer to the front surface than to the back surface of the semiconductor substrate.

18. The semiconductor structure of claim 17, wherein the front side metallization layer includes an area free from conductive material, and the area fully covers the cavity from the top view.

19. A semiconductor structure, comprising:
- a semiconductor substrate, including:
  - a front surface;
  - a back surface; and
  - an electrically non-conductive region passing through the semiconductor substrate from the front surface to the back surface;
- a first metallization layer formed at the back surface of the semiconductor substrate, the first metallization layer including an inductor structure overlaps the electrically non-conductive region from a top view;
- a contact via passing through the semiconductor substrate, wherein the inductor structure is coupled to the contact via; and
- a front-end-of-line (FEOL) layer formed over the semiconductor substrate, the FEOL layer being closer to the front surface than to the back surface of the semiconductor substrate.

20. The semiconductor structure of claim 19, further comprising a second metallization layer formed at the front surface of the semiconductor substrate, and the inductor structure is coupled to the second metallization layer through the contact via.

* * * * *